United States Patent [19]

Awtrey

[11] 3,943,544
[45] Mar. 9, 1976

[54] METAL-INSULATOR-SEMICONDUCTOR STRUCTURE HAVING MEANS FOR CANCELING NOISE

[75] Inventor: James D. Awtrey, Garland, Tex.

[73] Assignee: Texas Instruments Incorporated, Dallas, Tex.

[22] Filed: Nov. 11, 1974

[21] Appl. No.: 522,658

Related U.S. Application Data

[63] Continuation of Ser. No. 347,259, April 2, 1973, abandoned.

[52] U.S. Cl. ............................................. 357/24
[51] Int. Cl.² .................................... H01L 29/78
[58] Field of Search ..................... 357/24; 307/304

[56] References Cited
UNITED STATES PATENTS
3,814,955   6/1974   Itoh et al. ............................. 357/24

Primary Examiner—Martin H. Edlow
Assistant Examiner—E. Wojciechowicz
Attorney, Agent, or Firm—Harold Levine; James T. Comfort; Richard L. Donaldson

[57] ABSTRACT

A metal-insulator-semiconductor structure is disclosed which includes provision for canceling clock-line noise. In a preferred embodiment, the noise radiated by and capacitively coupled from the multiphase clock lines in a charge-coupled-device structure is canceled by forming at least one passive diode adjacent the output diode of the CCD. The passive diode is spaced from the clock lines by a distance which as closely as possible matches the distance which the output diode is spaced from the clock lines. The output diode is connected to the non-inverting input of a differential amplifier while the passive diode is connected to the inverting input of the differential amplifier; the differential amplifier can be either formed on the chip or separate from the chip. The clock line radiated noise is common to both diodes and is therefore canceled by the differential amplifier.

9 Claims, 4 Drawing Figures

METAL-INSULATOR-SEMICONDUCTOR STRUCTURE HAVING MEANS FOR CANCELING NOISE

This is a continuation, of application Ser. No. 347,259, filed Apr. 2, 1973, abandoned.

The present invention pertains to metal-insulator-semiconductor structures in general, and more particularly to such a structure which includes provision for canceling clock-line noise.

Metal-Insulator-Semiconductor (MIS) structures such as insulated gate field effect transistors, have enjoyed increased utilization in the electronics industry largely due to cost savings enabled by their simple structure. Charge transfer device (CTD) MIS structures such as bucket-brigade devices (BB) and charge coupled devices (CCD) promise even greater advantages with respect to higher packing density and still lower costs. A CCD device is basically a semiconductor analog shift register fabricated on a uniformly doped semiconductor substrate. The "charge-coupling" consists of storing minority carriers in potential wells at the semiconductor surface and transporting these carriers along the surface by translating the potential wells. The device structure is very simple, including basically a thermally oxidized semiconductor substrate with single-level metal electrodes on the oxidized surface. The potential wells are produced by applying a voltage to the metal electrodes. A convenient technique for translating the potential wells along the semiconductor surface is to connect every third electrode to a separate clock line. A set of three electrodes defines one element or bit; one electrode to hold and transmit the charge, the second electrode to receive the charge, and the third electrode to provide directionality to the charge flow. In this structure, a three-phase pulse sequence applied to the clock lines is effective to transport a train of "charge packets" along the semiconductor surface. Diodes are generally used to inject charge into the potential wells at the input and to direct the presence of minority carriers at the output. The basis of the charge transport is the coupling of potential wells under adjoining electrodes so that the minority carriers may be transferred from under one electrode to the next electrode.

Charge transfer devices such as the BB and CCD are described extensively in the literature. To date, a major problem standing in the way of full realization of the advantages possessed by CTDs is the noise generated by the multi-phase clock lines. This noise is both radiated and capacitively coupled through the substrate by the clock-lines and is detected by the output diode, making detection of the signal very difficult and at times impossible. Conventional layout and shielding techniques have been largely unsuccessful in eliminating this noise.

One proposed technique for reducing the clock-line noise requires the formation of a duplicate CCD on the seimiconductor chip parallel to the active, i.e., signal carrying CCD. The duplicate CCD is identical to the active CCD except no data is processed by it. Thus, the output of the duplicate CCD contains only noise components. The output is combined with the output of the active CCD in order to cancel the noise. An obvious disadvantage of this technique is the fact that it requires twice the semiconductor area in order to form one CCD. This seriously detracts from the cost savings potential of CTDs.

Another technique which as been proposed for canceling a clock-line noise employs sample-and-hold circuits to average the A.C. clock-line noise to zero over a bit period. This technique is undesirable for several reasons. First, the upper frequency limit of conventional sample-and-hold circuits is only about 1.5 MHz or less, as compared to a frequency capability of a CCD which approaches 100 MHz. Thus, this technique would severely limit the frequency capabilities of CTDs. Further, the sample-and-hold circuits consume substantial amounts of power, require additional real estate on the semiconductor chip, require adjustment, and are relatively expensive.

Accordingly, an object of the present invention is the provision of improved means for canceling radiated noise in a MIS structure.

A furher object of the invention is the provision of a MIS structure having means for canceling clock-line noise wherein the noise canceling means require only a small amount of additional real estate on the semiconductor chip.

Another object of the invention is the provision of a CTD structure including means for canceling clock-line noise which noise canceling means do not require adjustment.

Still another object of the invention is the provision of a CCD having a passive diode with external electrical connection adjacent the output diode wherein the signal from the passive diode corresponds to only the clock-line noise and which can be combined with the signal from the output diode in order to cancel the noise components.

Briefly in accordance with the invention a MIS structure is defined to include a passive diode for detecting clock-line noise. In a preferred embodiment, a passive diode is defined adjacent the output diode of a CCD. The passive diode is spaced from the clock lines by a distance which as closely as possible matches the distance by which the output diode is spaced from the clock-lines. The output diode is connected to one input of a differential amplifier, such as the non-inventing input, and the passive diode is connected to the other input, such as the inverting input. The output from the passive diode is produced only by noise generated by the clock lines. The output from the output diode is a combination of the same noise and the desired signal. The differential amplifier substantially cancels the clock-line generated noise.

Other objects and advantages of the invention will be apparent upon reading the following detailed description of illustrative embodiments in conjunction with the drawings wherein.

Figure 1:
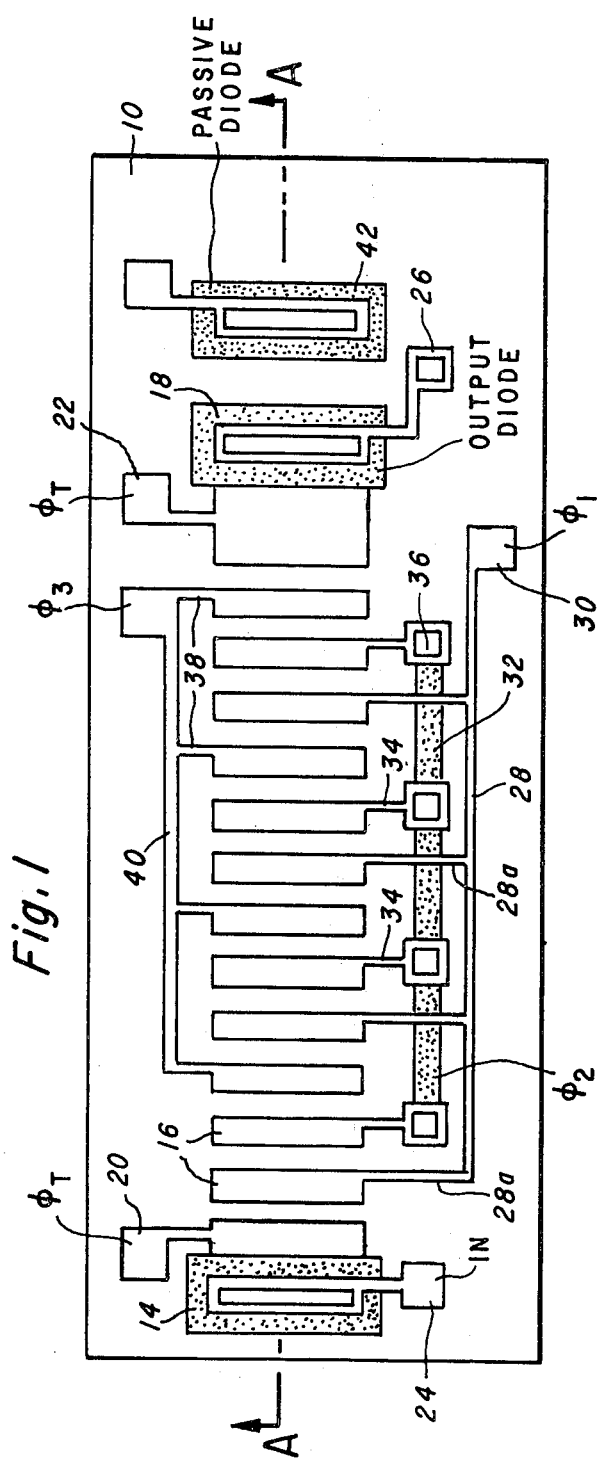
FIG. 1 is a plan view of a CCD embodying a passive diode in accordance with the present invention.
Figure 2:
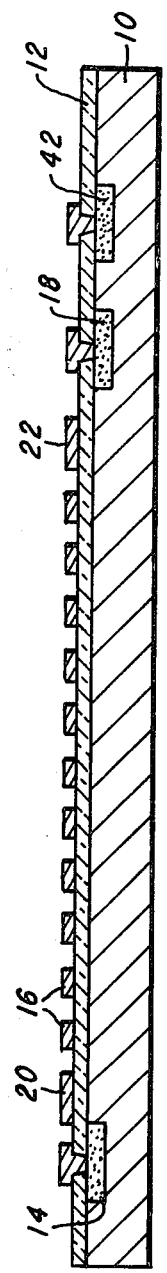
FIG. 2 is a cross-sectional view of FIG. 1 along the line A—A.

With reference now to FIGS. 1 and 2, an illustrative embodiment of the invention in a three phase CCD shift register is shown. It is appreciated, of course, that the present invention is applicable to any MIS structure where cancelation of radiated noise is desired.

A semiconductor substrate is shown generally at 10. Preferably the substrate is n-type silicon, although p-type silicon and other semiconductor materials may be used. A relatively thin insulating layer 12 is formed over the surface of the substrate. A CCD shift register comprising an input diode 14, a plurality of electrodes shown generally at 16 and an output diode 18 is formed by conventional well known techniques. Transfer electrodes 20 and 22 are also illustrated in FIG. 1. An input signal is applied to the expanded contact 24 which extends through a window in the insulating layer 12 into ohmic contact with the diode 14. Similarly, the CCD output is taken from contact 26 which electically contacts the output diode 18 through a second window through the layer 12. Three separate clock-lines are defined for applying the three-phase pulses to the electrodes 16. The clock-line for phase 1 of the clock is formed by a conductive path 28 formed over the insulating layer 12. Every third electrode is connected to conductive path 28 by a conductive lead which also extends over the surface of the layer 12. An expanded contact 30 is provided for receiving phase 1 clock signals.

The phase two clock line is defined by a highly doped path 32 in the substrate. The path 32 is substantially conductive. Electrodes which are to receive phase two clocks are connected to the doped region 32 by conductive leads 34 which are ohmically connected to the layer 32 by conventional conductive feed-throughs 36 through windows in the layer 12.

Phase three of the clock is applied to the associated electrodes by leads 38 which connect the electrodes to the phase-three clock-line 40. Conductive leads 38 and line 40 are formed over the insulative layer 12.

A passive diode 42 having an ohmic contact 27 is formed in the substrate 10 adjacent to the output diode 18. The diode 42 is passive in that the signal propagated by the CCD is not detected by the diode 42 since there is no transfer electrode to transfer the charge to the location of the diode 42. The passive diode 42 is formed in the substrate 10 at a location where it will experience substantially the same clock-line noise as the output diode 18. In FIG. 1 the passive diode 42 is shown immediately adjacent the output diode 18. Other locations may be more advantageous in that the diffused clock-line 32 generates relatively more noise than clock-lines 28 or 40. The optimum location of the passive diode 42 will vary depending upon the particular design of the MIS structure.

Figure 3:
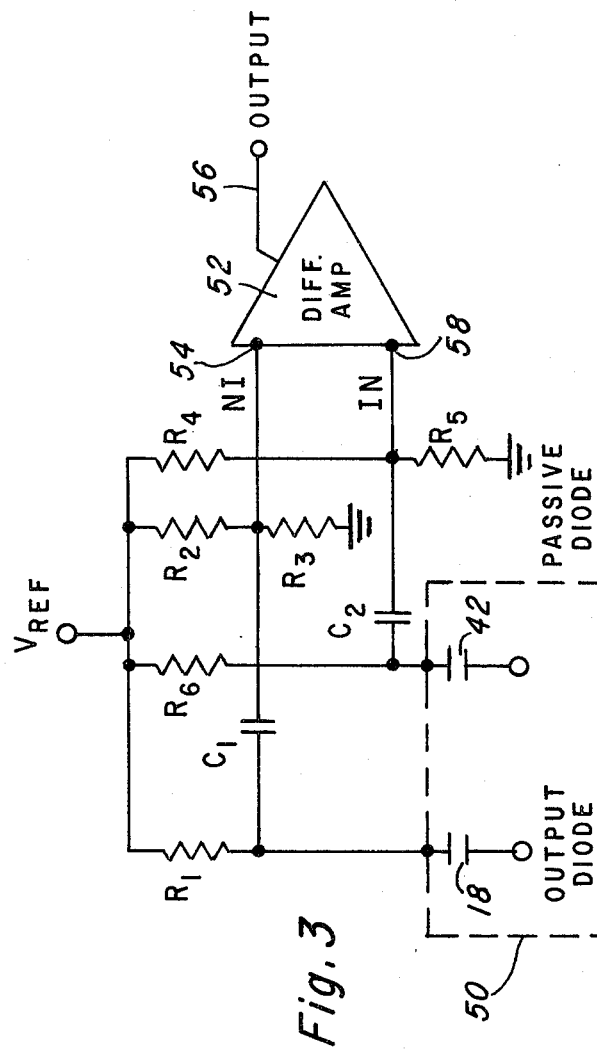
FIG. 3 is a schematic diagram illustrating connection of the output diode and passive diode in FIG. 1 to a differential amplifier.

With reference now to FIG. 3 there is schematically illustrated a circuit arrangement for receiving the outputs from the passive diode and output diode 42 and 18 respectively, and effecting clock-line associated noise cancellation. A semiconductor chip on which the MIS structure, such as the CCD in FIG. 1, and the passive diode are formed is shown at 50. For clarity of illustration the output diode 18 and the passive diode 42 are shown schematically on the chip 50, and other metallization and substrate doped regions are omitted. Similar to conventional CTD detection techniques, the output of the diode 18 is processed external to the chip 50. The chip is housed in a package and the output diode 18 is connected to a header pin, which provides means external (to the chip) for accessing the diode output. The output of the diode 18 is connected to a reference voltage potential $V_{REF}$ through a resistor $R_1$. For an n-channel silicon CCD, a suitable voltage for $V_{REF}$ can be on the order of +10 volts d.c. Resistors $R_2$ and $R_3$ are connected between the voltage source $V_{REF}$ and circuit ground, the juncture between resistors $R_2$ and $R_3$ being connected to one input of a differential amplifier 52, such as the non-inverting input 54. The output of the diode 18 is A.C. coupled to input 54 of the differential amplifier by capacitor $C_1$. The differential amplifier 52 amplifies the signal (i.e., quantity of charge) detected by the output diode 18 and provides an amplified output 56.

The output of the passive diode 42 is also coupled to the differential amplifier. As a result of the placement of the passive diode 42 on the chip 50 with respect to the multiphase clock-lines, the output of the passive diode is only clock-generated noise which noise is substantially identical to the noise detected by the output diode 18. Access to the passive diode output is provided by an additional header pin on the package. The passive diode output is A.C. coupled to capacitor $C_2$ to the other input of the differential amplifier, such as the inverting input 58. The inverting input is held at a constant d.c. level by the voltage divider defined by resistors $R_4$ and $R_5$, connected between the $V_{REF}$ and circuit ground. The diode 42 is also connected to the $V_{REF}$ through a resistor $R_6$. Since the clock-line noise components are simultaneously present on opposite inputs of the differential amplifier 52, only the difference i.e., only the true signal will be amplified to the output 56, the noise being substantially canceled. Differential amplifiers suitable for use in the present invention are well known in the art; one suitable such amplifier is marketed by Texas Instruments Incorporated, Dallas, Tex., and is identified by model SN72733.

Figure 4:
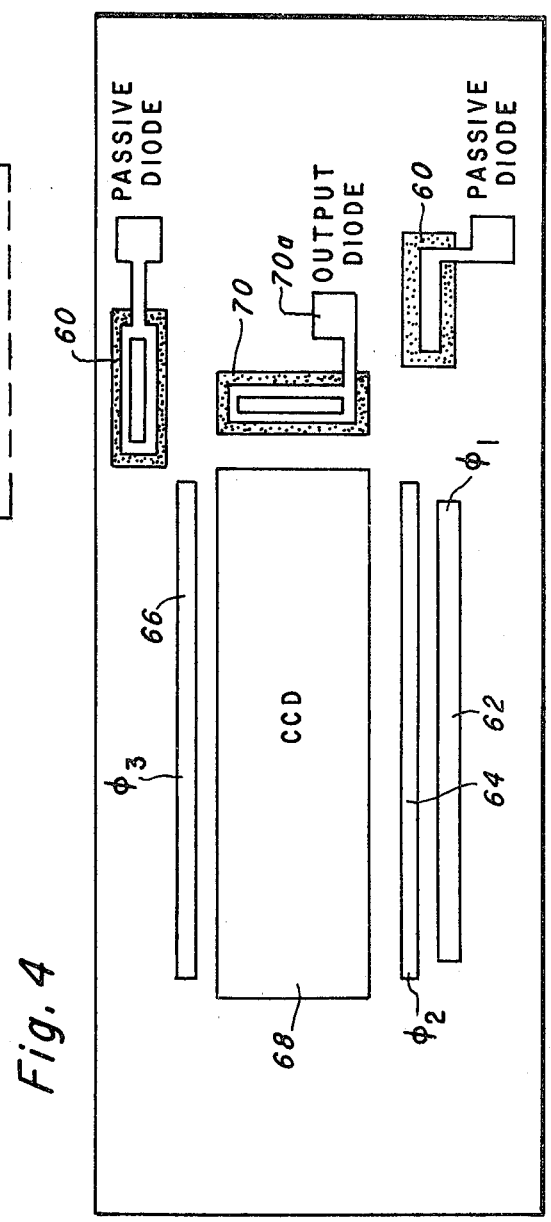
FIG. 4 is a plan view illustrating an alternate embodiment which employs a plurality of passive diodes.

With reference now to FIG. 4, an alternate embodiment of the invention is illustrated wherein a plurality of passive diodes 60 are utilized instead of such a single passive diode as in FIG. 1. The $\phi_1$, $\phi_2$, and $\phi_3$ clock lines are illustrated in block diagram at 62, 64 and 66, and the CCD electrodes are shown in block diagram at 68, for clarity of description. An output diode is shown at 70 with an expanded contact at 70a. The passive diodes 60 are located in this embodiment at a position such that their combined signal substantially equals the clock-line noise experienced by the output diode 70. Exact location of the passive diodes will of course be influenced by circuit layout and the number of passive diodes used. The important consideration is the recognition that the clockline noise is both radiated and capacitively coupled through the substrate and will be detected by a passive diode spaced from the clock lines by a distance effectively the same as the distance the output diode is spaced from the clock lines. Given this, one skilled in the art can determine the optimum location of the passive diodes.

The plurality of passive diodes can be connected to a common header pin or to separate header pins and then commonly connected to one terminal of the differential amplifier.

In accordance with the invention a 64-bit three phase CCD was defined on an n-type silicon substrate. The bit size was about 1.8 square mils. A single passive diode was formed adjacent the output diode similar to the arrangement shown in FIG. 1. The passive diode was spaced from the output diode by about 4 mils, and the passive diode was connected to a header pin adjacent the output diode header pin. The CCD was operated both with the passive diode connected as shown in FIG. 3, and without the diode in place. With the passive diode in place noise reduction on the order of 7.5 db was observed.

It will be seen that the various objects of the invention have been advantageously achieved. Noise cancelation has been provided without heretofore adverse results of increased chip area, more power, excess cost, frequency limitations, or requirements for adjustments. While the invention has been described in detail with respect to specific embodiments, it will be apparent to those skilled in the art that the invention has applicability to a myriad of MIS structures, and that various modifications may be made for use in such structures without departing from the spirit or scope of the invention. By way of example, it is apparent that the present configuration for eliminating clock-line noise is also effective with other CCD clock systems such as the two phase and four phase clock configurations.

What is claimed is:

1. An improved semiconductor device comprising a semiconductor substrate incorporating a conductor-insulator-semiconductor signal processing structure wherein multi-phase clock lines are utilized to control transfer of data signals from one location in said signal processing structure to another spaced location in said structure, said other location comprising output means incorporated in said semiconductor substrate, and means operable for selectively coupling said signal processing structure with said output means for transfer of data from said signal processing structure to said output means; a diode formed in said semiconductor substrate adjacent said output means for receiving noise signals resulting from operation of said signal processing structure; and differential amplifier means connected to said semiconductor device for differentially combining signals from said output and from said diode; wherein said improvement comprises formation of said diode physically separate from said signal processing structure and from said selective coupling means such that said semiconductor substrate provides the only electrical coupling between said diode and said signal processing structure and such that said diode is effective without application of an external control signal thereto to provide an output signal corresponding substantially to noise signals propagated to said diode through said semiconductor substrate during operation of said signal processing structure.

2. An improved semiconductor device as set forth in claim 1 including capacitors for A.C. coupling said output means and said diode to inputs of said differential amplifier.

3. An improved charge coupled device shift register comprising:

a semiconductor substrate of one conductivity type;
a relatively thin insulating layer extending over a surface of said substrate;
a plurality of laterally spaced transfer electrodes over said insulating layer;
first, second and third conductive clock lines selectively connected to said transfer electrodes; said clock lines disposed for receiving multi-phase clock pulses;
first, second and third spaced apart regions of opposite conductivity type in said semiconductor substrate at the surface thereof underlying the insulating layer; said first region of opposite conductivity type disposed at one end of said plurality of transfer electrodes, input contact means ohmically connected with said first region for receiving input signal data, and input transfer electrode means for transferring charge corresponding to input signal data from said first region to a region of said semiconductor substrate beneath said one end of said plurality of laterally spaced transfer electrodes for transfer of said charge along said shift register in response to said clock pulses;
said second region of opposite conductivity type disposed adjacent an opposite end of said plurality of laterally spaced electrodes; said third region being located adjacent said second region and spaced from said shift register and clock lines;
output transfer electrode means operatively associated with said second region for transferring charge from said shift register at said opposite end of said plurality of laterally spaced transfer electrodes to said second region, and contact means ohmically connected to said second region for providing an output signal;
contact means ohmically connected to said third region for providing an output signal generated by clock line noise propagated through said substrate to said third region of opposite conductivity type; and
differential amplifier means connected to said shift register for differentially combining signals from said contact means connected to said second and third regions to produce an amplified signal having a substantially reduced clock line noise component; wherein said improvement comprises: disposition of said third region physically separate from said shift register and said clock lines and disposition of said output transfer electrode means physically and electrically separate from said third region, such that external coupling to said third region is provided only by said contact means ohmically connected to said third region for providing an output signal generated by clock line noise propagated to said third region through said semiconductor substrate.

4. A charge-coupled-device shift register as set forth in claim 3 wherein said third region of opposite conductivity type is spaced from said clock lines by a distance which is substantially the same as the distance by which said second region of opposite conductivity type is spaced from said clock lines such that the clock-line noise experienced by each of said second and third regions of opposite conductivity type is substantially the same.

5. An improved charge transfer device comprising:

a semiconductor substrate of one conductivity type;
a charge transfer device shift register defined on said substrate, an input pn junction, means for selectively coupling said input pn junction with said shift register to enter input data into said shift register, a plurality of conductive clock lines for controlling transfer of data along said shift register, an output diode, and transfer means for selectively coupling said output diode with said shift register for detecting charge corresponding to said data;
noise reduction diode means defined in said substrate adjacent to said output diode and spaced from said shift register for receiving noise signals transmitted through said substrate during operation of said shift register;
a differential amplifier connected with said shift register for differentially combining signals from said output data and from said noise reduction diode means to provide an amplified output signal having a reduced clock line noise component; wherein the improvement comprises disposition of said noise reduction diode means physically separate from such shift register, and disposition of said selective coupling means to provide coupling only between said output diode and said shift register such that said noise reduction diode means is responsive only to noise signals transmitted through said semiconductor substrate during operation of said shift register thereby to produce a noise output signal responsive to said noise signals.

6. A charge transfer device as set forth in claim 5 including capacitors for A.C. coupling said noise reduction diode means and said output diode to said differential amplifier.

7. A charge transfer device as set forth in claim 6 wherein said noise reduction diode means is formed in said substrate at a location spaced from said clock line by substantially the same distance by which said output diode is spaced from said clock lines.

8. A charge transfer device as set forth in claim 7 wherein said noise reduction diode means includes a plurality of diodes spaced on said substrate at selected locations separate from said shift register such that the combined outputs therefrom due to clock line noise substantially equals the clock noise experienced by said output diode.

9. A charge coupled device shift register comprising
a semiconductor substrate of one conductivity type;
a relatively thin insulating layer extending over a surface of said substrate;
a plurality of electrically spaced transfer electrodes over said insulating layer;
at least two clock lines selectively connected to said transfer electrodes, said clock lines extending transversally of said transfer electrodes for supplying multi-phase clock pulses to said electrodes;
first and second spaced apart regions of opposite conductivity type in said semiconductor substrate at a surface thereof underlying said insulating layer;
said first region of opposite conductivity type disposed at one end of said plurality of transfer electrodes; input contact means ohmically connected with said first region for receiving input signal data; input transfer electrode means for transferring charge corresponding to input signal data from said first region to a region of said semiconductor substrate beneath said one end of said plurality of laterally spaced transfer electrodes for transfer of said charge along said shift register in response to said clock pulses;
said second region of opposite conductivity type disposed adjacent an opposite end of said plurality of laterally spaced transfer electrodes; output transfer electrode means operatively associated with said second region for transferring charge from said shift register at said opposite end of said plurality of laterally spaced transfer electrodes to said second region; and first conductor means ohmically connected to said second region for providing an output signal;
a plurality of further regions of opposite conductivity type in said semiconductor substrate at the surface thereof underlying said insulating layer and disposed at said opposite end of said plurality of laterally spaced transfer electrodes, said further regions being physically separate from said shift register, said clock lines and said output transfer electrode and electrically coupled thereto only through said semiconductor substrate to receive only noise signals propagated through said semiconductor substrate during operation of said shift register, said further regions being spaced from said clock lines by an amount approximating the distance between said second region of opposite conductivity type and said clock lines; and wherein the only external electrical coupling to said further regions comprises a plurality of second electrical conductor means ohmically connected with respective ones of said further regions; and
differential amplifier means connected to said shift register, said differential amplifier having a first input connected with said first conductor means and a second input connected to each of said plurality of second conductor means, said differential amplifier adapted to differentially combine signals at said first and second inputs thereof to produce an output signal substantially free of said clock line noise.

* * * * *